(12) United States Patent
Cho et al.

(10) Patent No.: US 7,309,405 B2
(45) Date of Patent: Dec. 18, 2007

(54) METHOD OF FORMING ITO FILM

(75) Inventors: Jun-Sik Cho, Seoul (KR); Young-Gun Han, Seoul (KR); Young-Whoan Beag, Seoul (KR); Seok-Keun Koh, Seoul (KR)

(73) Assignee: P & I Corp., Seoul (KR)

( * ) Notice: Subject to any disclaimer, the term of this patent is extended or adjusted under 35 U.S.C. 154(b) by 561 days.

(21) Appl. No.: 10/751,972

(22) Filed: Jan. 7, 2004

(65) Prior Publication Data

US 2004/0140198 A1 Jul. 22, 2004

(30) Foreign Application Priority Data

Jan. 15, 2003 (KR) .................. 10-2003-0002838

(51) Int. Cl.
*C23C 14/35* (2006.01)
(52) U.S. Cl. .................. 204/192.29; 204/192.11; 204/192.12
(58) Field of Classification Search ........... 204/192.11, 204/192.12, 192.29
See application file for complete search history.

(56) References Cited

U.S. PATENT DOCUMENTS

| | | | |
|---|---|---|---|
| 4,399,015 A | | 8/1983 | Endo et al. |
| 4,973,345 A | * | 11/1990 | France .................. 65/389 |
| 5,605,610 A | * | 2/1997 | Ishibashi .............. 204/192.29 |
| 5,783,641 A | | 7/1998 | Koh et al. |
| 6,319,326 B1 | | 11/2001 | Koh et al. |
| 6,645,843 B2 | | 11/2003 | Kim et al. |
| 2001/0015319 A1 | * | 8/2001 | Choe et al. .................. 204/408 |

FOREIGN PATENT DOCUMENTS

JP 05-171437 * 7/1993

OTHER PUBLICATIONS

Machine Translation of Japan 05-171437 dated Jul. 1993.*

* cited by examiner

*Primary Examiner*—Rodney G. McDonald
(74) *Attorney, Agent, or Firm*—Birch, Stewart, Kolasch & Birch LLP

(57) ABSTRACT

Disclosed is a method of forming an ITO film by optimized sequential sputter deposition of seed and bulk layers having different sputter process conditions, which is applicable to various display devices, and more particularly, to an organic light-emitting device needing an ultra-planarized surface roughness. In forming a transparent conducting electrode of a display device on a transparent substrate with an ITO film including a seed layer and a bulk layer, a method of forming the ITO film includes a first sputter deposition step of forming the ITO film on the substrate with sputtering gas supplied to an ion source at an ambience of oxygen flowing in the vicinity of the substrate and a second sputter deposition step of forming the ITO film with the sputtering gas supplied to the ion source only, wherein the first and second sputter deposition steps have different process conditions, respectively and wherein the seed and bulk layers are deposited by the first or second sputter deposition step.

12 Claims, 10 Drawing Sheets

FIG.5A
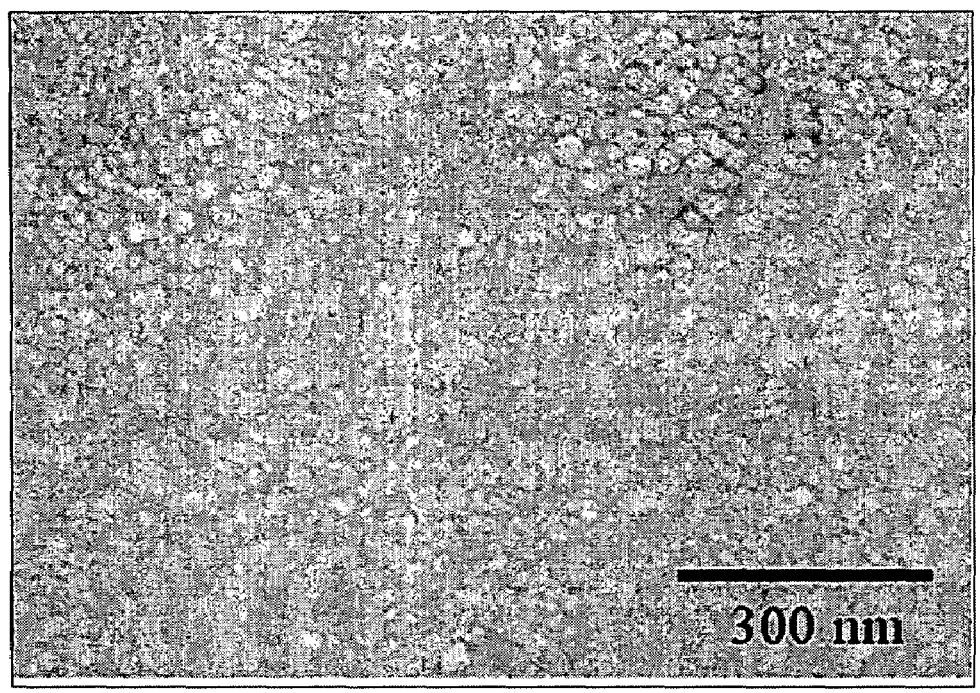
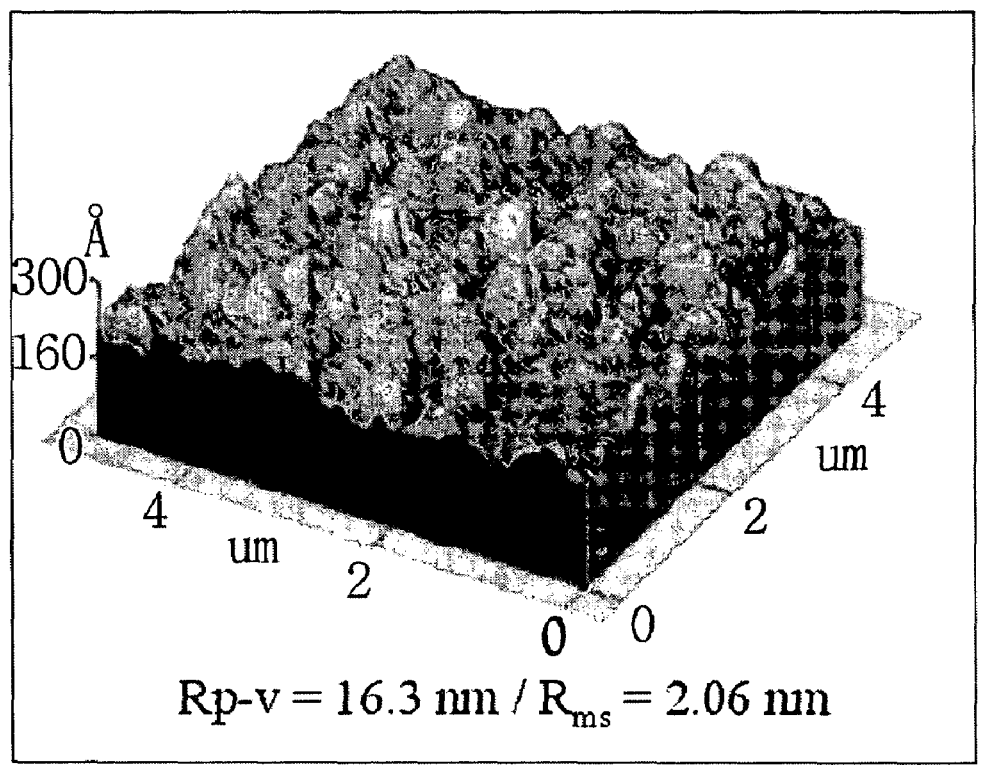
Rp-v = 16.3 nm / $R_{ms}$ = 2.06 nm

FIG. 5B
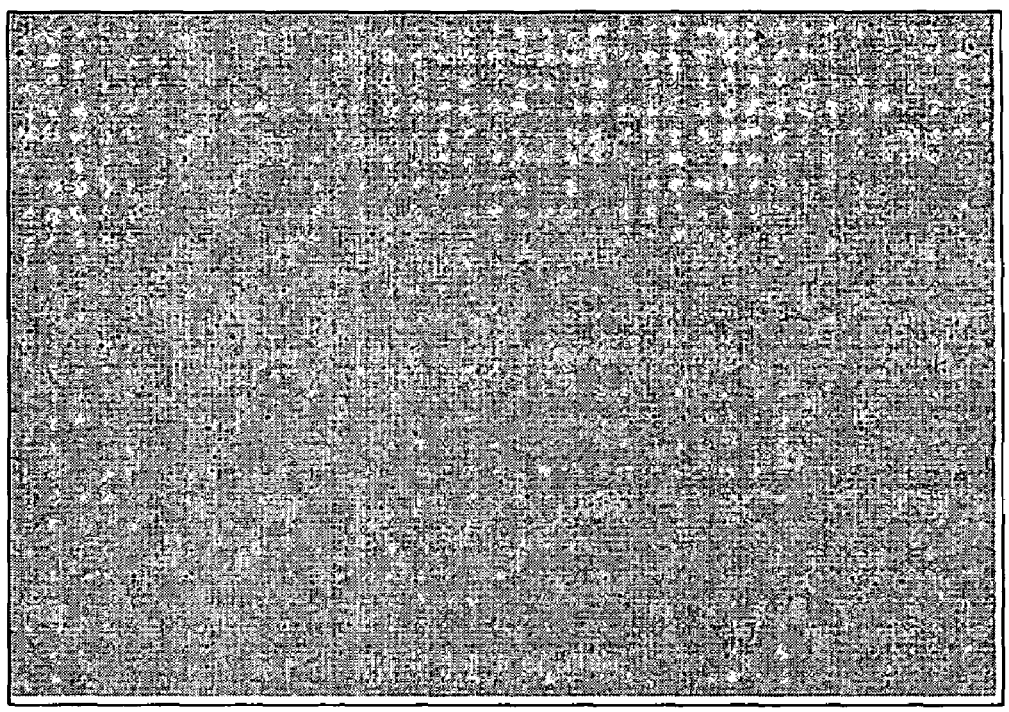
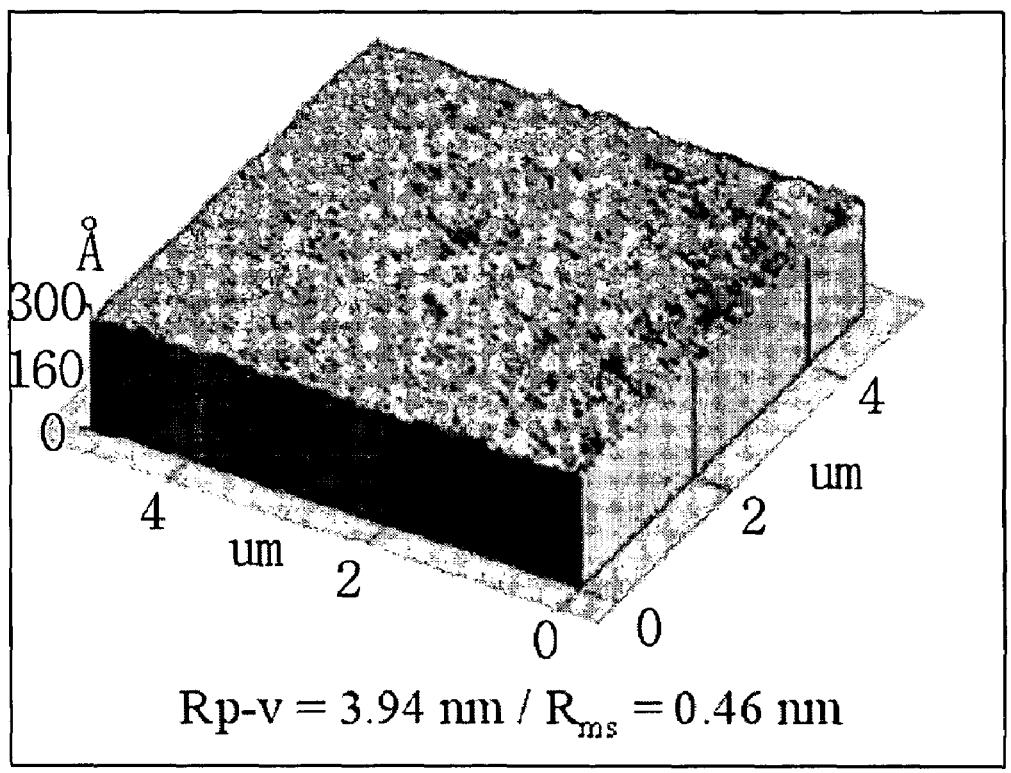
Rp-v = 3.94 nm / $R_{ms}$ = 0.46 nm

FIG.5C
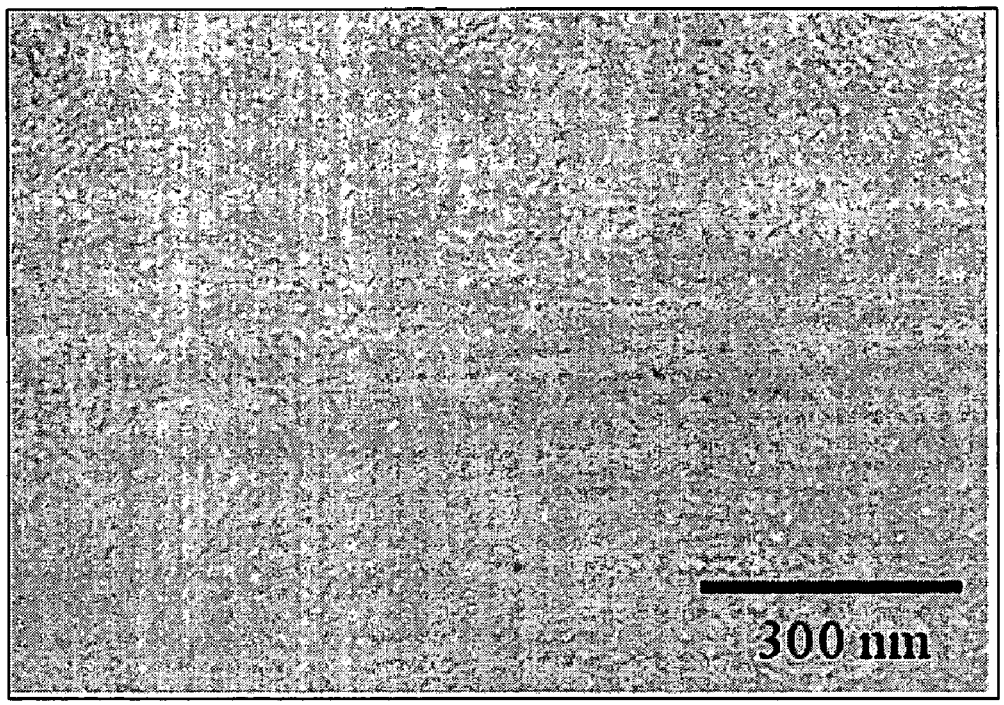
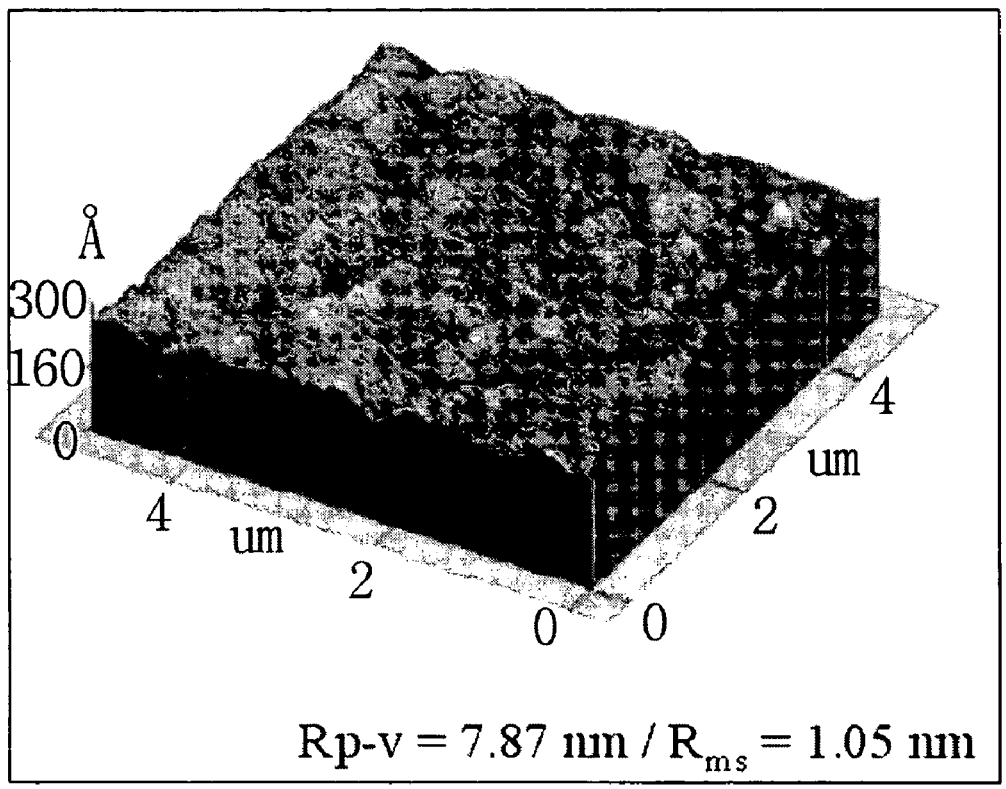
Rp-v = 7.87 nm / $R_{ms}$ = 1.05 nm

FIG. 5D
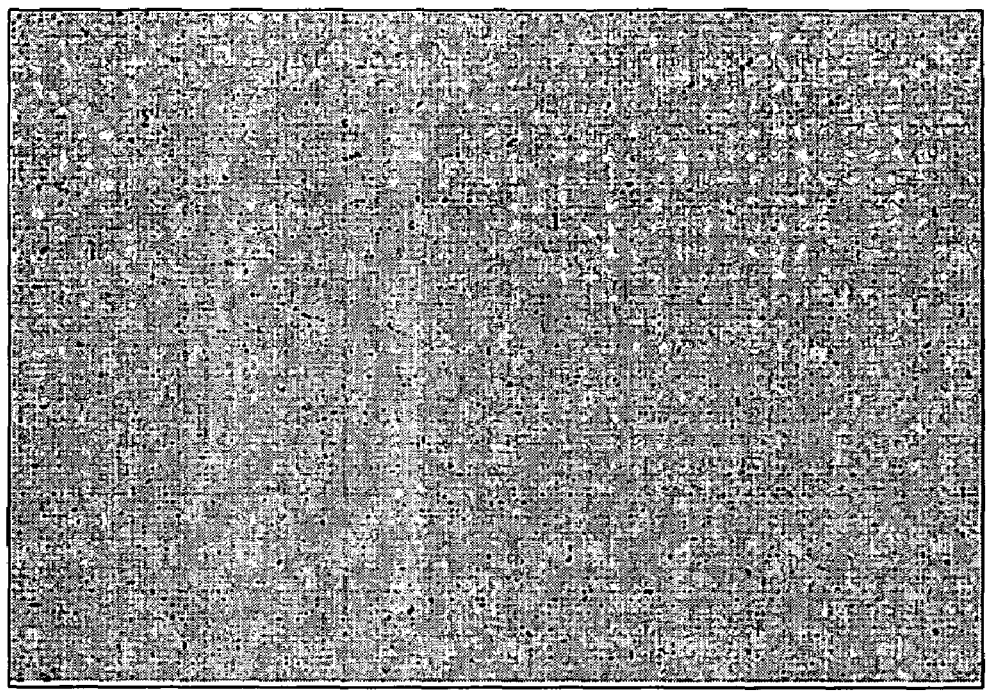
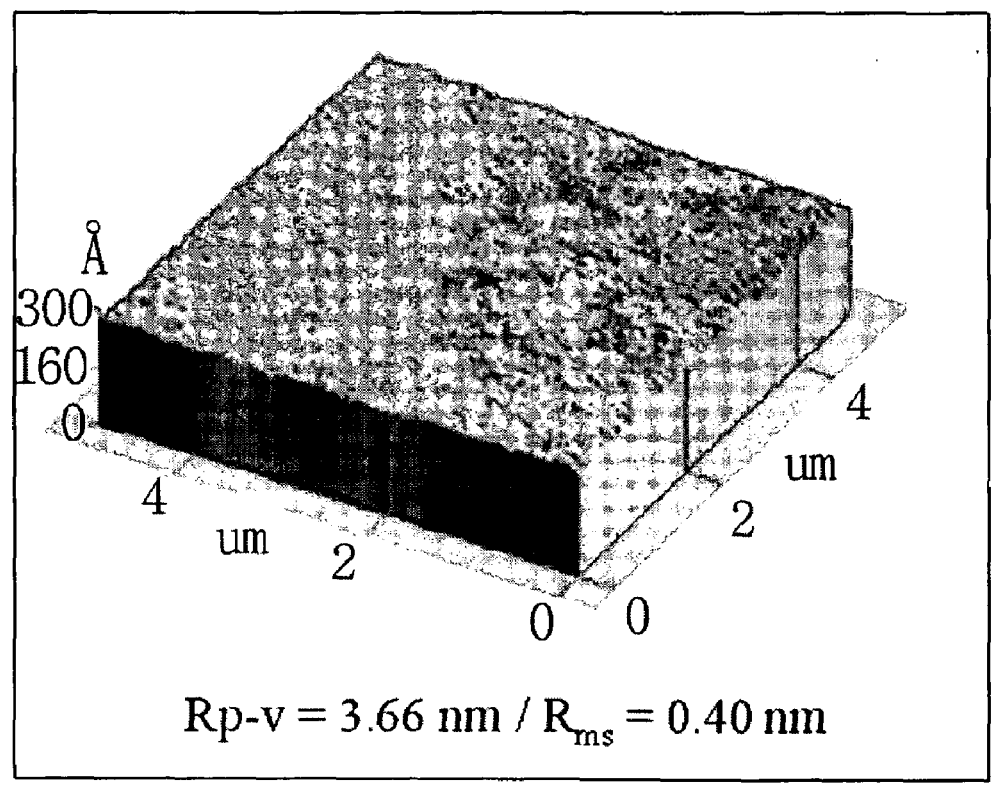
Rp-v = 3.66 nm / $R_{ms}$ = 0.40 nm

METHOD OF FORMING ITO FILM

This Non-provisional application claims priority under 35 U.S.C. § 119(a) on Patent Application No(s). 10-2003-0002838 filed in Korea on Jan. 15, 2003, the entire contents of which are hereby incorporated by reference.

BACKGROUND OF THE INVENTION

1. Field of the Invention

The present invention relates to a method of forming ITO film, and more particularly, to a method of forming ITO film by optimized sequential sputter deposition of seed and bulk layers having different sputter process conditions, which is applicable to various display devices, and more particularly, to an organic light-emitting device needing an ultra-planarized Surface roughness.

2. Background of the Related Art

Generally, a transparent conducting oxide (hereinafter abbreviated TCO) film of a display device is used for an optoelectronic device due to its inherent attributes such as high optical transmission in a visible ray range and low resistance. Tin-doped indium oxide (hereinafter abbreviated ITO) among TCO films including $In_2O_3$, Sn-doped $In_2O_3$ (ITO), ZnO, Al-doped ZnO (AZO), and the like, which can be deposited at a relatively low temperature below 200° C. and has an excellent optical transmission, an excellent electrical conductivity, and an excellent etch attribute essential to a process of forming pixels of a display device, has been mainly used. An ITO film, which is a very important element of an optoelectronic device, is widely used in a flat panel display field including LCD, PDP, OLED, etc.

The ITO film is growed by physical vapor deposition (PVD) such as DC magnetron sputtering, RF magnetron sputtering, medium frequency magnetron sputtering, ion beam sputtering, and thermal evaporation or chemical vapor deposition (CVD) such as spray pyrolysis, spin coating, etc. Physical and chemical properties (specific electrical resistance, visible ray transmittance, Surface roughness, etc.) of the ITO film vary according to deposition method and condition.

Lately, many efforts are made to development of an organic light-emitting device (OLED) as a next generation flat panel display. The organic light-emitting device (hereinafter abbreviated OLED) is advantageous in self-luminescence, low voltage drive, fast response, wide viewing angle, and the like, thereby standing in the spotlight in the field of the next generation flat panel display panel, OLED adopts a current drive system, whereas LCD uses a voltage drive system. In case of the current drive system, electric charges are accumulated on a tip of a peak(protrusion) of an electrode surface to easily generate a spark, thereby degrading or causing damage to the device. Hence, great importance is attached to a surface property of an ITO film used as an anode of OLED as well as electrical and optical properties as the inherent attributes of the TCO film.

FIG. 1 is a cross-sectional view of an ITO film as a transparent conducting electrode used as an anode of OLED according to a related art.

Referring to FIG. 1, a surface of an ITO film formed by a method according to a related art has a Surface roughness of several tens to several hundreds nm. A spark is generated from a rough peak of the ITO film to cause damage to a pixel defined by patterning the ITO film on a substrate into pixel units, thereby forming a dark spot. And, an electric field according to a surface morphology varies so that some pixels are unable to function well. Moreover, it is highly probable that a pin hole may be formed because of a rough interface of the ITO film with hole transport layer (HTL), organic light-emitting layer (EL), and metal cathode layer successively stacked on the ITO film electrode (anode), i.e., ITO/HTL/EL/Ca/Ag arrangement configuration. In case of a high Surface roughness, the ITO film electrode (anode) is brought direct contact with the metal cathode layer to cause a short circuit. Thus, the Surface roughness of the ITO film electrode (anode) has great influence on operation and stability of OLED. Moreover, in case of LCD, a rough surface of an ITO film brings about charge carrier scattering that reduces electrical conductivity, whereby a surface structure of the ITO film is very important in being applied to TFT-LCD. Besides, the rough surface of the ITO film lowers optical transmission because of scattering loss.

Electrical and optical characteristics and stability of ITO film formed by vacuum sputtering including magnetron sputtering are superior to those of ITO film formed by thermal evaporation or CVD. Yet, the ITO film formed by vacuum sputtering including magnetron sputtering fails to have the planarized surface meeting the requirement for OLED. The Surface roughness requirements of the ITO film applicable to OLED are RMS (root mean square) roughness $\leq 2$ nm and Rp-v (peak to valley)roughness $\leq 10$ nm. Hence, in order to lower the Surface roughness of the ITO film formed by the current vacuum sputtering, the deposited ITO film is planarized by mechanical and/or chemical polishing. However, the mechanical and/or chemical polishing complicate the process of forming the ITO film for OLED. Besides, by-products such as polishing slurry and the like are generated and the residues of the polishing adhere to the surface thereof, whereby production yield is reduced and product costs are raised.

Other deposition methods skipping the polishing step after film deposition are tried to form an ultra-planarized ITO film without degradation of the electrical and optical characteristics. One of such deposition methods is mixed sputtering that a predetermined portion of DC sputtering is supplied by RF power. Another one of such deposition methods is depositing an amorphous ITO film instead of a crystalline ITO film. However, such methods are tried but to fail in forming an ITO film substantially applicable to OLED.

SUMMARY OF THE INVENTION

Accordingly, the present invention is directed to a method of forming ITO film that substantially obviates one or more problems due to limitations and disadvantages of the related art.

An object of the present invention is to provide a method of forming ITO film, by which ITO film has an ultra-planarized surface.

Another object of the present invention is to provide a method of forming an ITO film for an OLED device that needs an ultra-planarized Surface roughness.

Another object of the present invention is to provide a method of forming an ITO having an ultra-planarized surface, by which electrical and optical characteristics are prevented from being degraded.

Another object of the present invention is to provide a method of forming an ITO having an ultra-planarized surface, by which production yield is increased.

Another object of the present invention is to provide a method of forming an ITO having an ultra-planarized surface, by which mechanical and/ore chemical polishing is skipped.

Another object of the present invention is to provide a method of forming an ITO having an ultra-planarized surface, by which a surface roughness≦2 nm and peak to valley roughness (Rp-v)≦10 nm are achieved.

Another object of the present invention is to provide a method of forming an ITO having an ultra-planarized surface by optimized sequential sputter deposition of seed and bulk layers having different sputter process conditions Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, in forming a transparent conducting electrode of a display device on a transparent substrate with an ITO film including a seed layer and a bulk layer, a method of forming the ITO film according to the present invention includes a first sputter deposition step of forming the ITO film on the substrate with sputtering gas supplied to an ion source at an ambience of oxygen flowing in the vicinity of the substrate and a second sputter deposition step of forming the ITO film with the sputtering gas supplied to the ion source only, wherein the first and second sputter deposition steps have different process conditions, respectively and wherein the seed and bulk layers are deposited by the first or second sputter deposition step.

In another aspect of the present invention, in fabricating a display device having a transparent conducting electrode on a transparent substrate with an ITO film including a seed layer and a bulk layer, a method of fabricating the display device includes a first sputter deposition step of forming the ITO film on the substrate with sputtering gas supplied to an ion source at an ambience of oxygen flowing in the vicinity of the substrate and a second sputter deposition step of forming the ITO film with the sputtering gas supplied to the ion source only, wherein the first and second sputter deposition steps have different process conditions, respectively and wherein the seed and bulk layers are deposited by the first or second sputter deposition step.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 5A shows SEM and AFM images of surface micro structure and surface roughness of a transparent conducting ITO electrode according to comparison example 1;

FIG. 5B shows SEM and AFM images of surface micro structure and surface roughness of a transparent conducting ITO electrode according to comparison example 2;

FIG. 5C shows SEM and AFM images of surface micro structure and surface roughness of a transparent conducting ITO electrode according to embodiment 1;

FIG. 5D shows SEM and AFM images of surface micro structure and surface roughness of a transparent conducting ITO electrode according to comparison embodiment 2;

DETAILED DESCRIPTION OF THE PREFERRED EMBODIMENTS

Reference will now be made in detail to the preferred embodiments of the present invention, examples of which are illustrated in the accompanying drawings.

Figure 1:
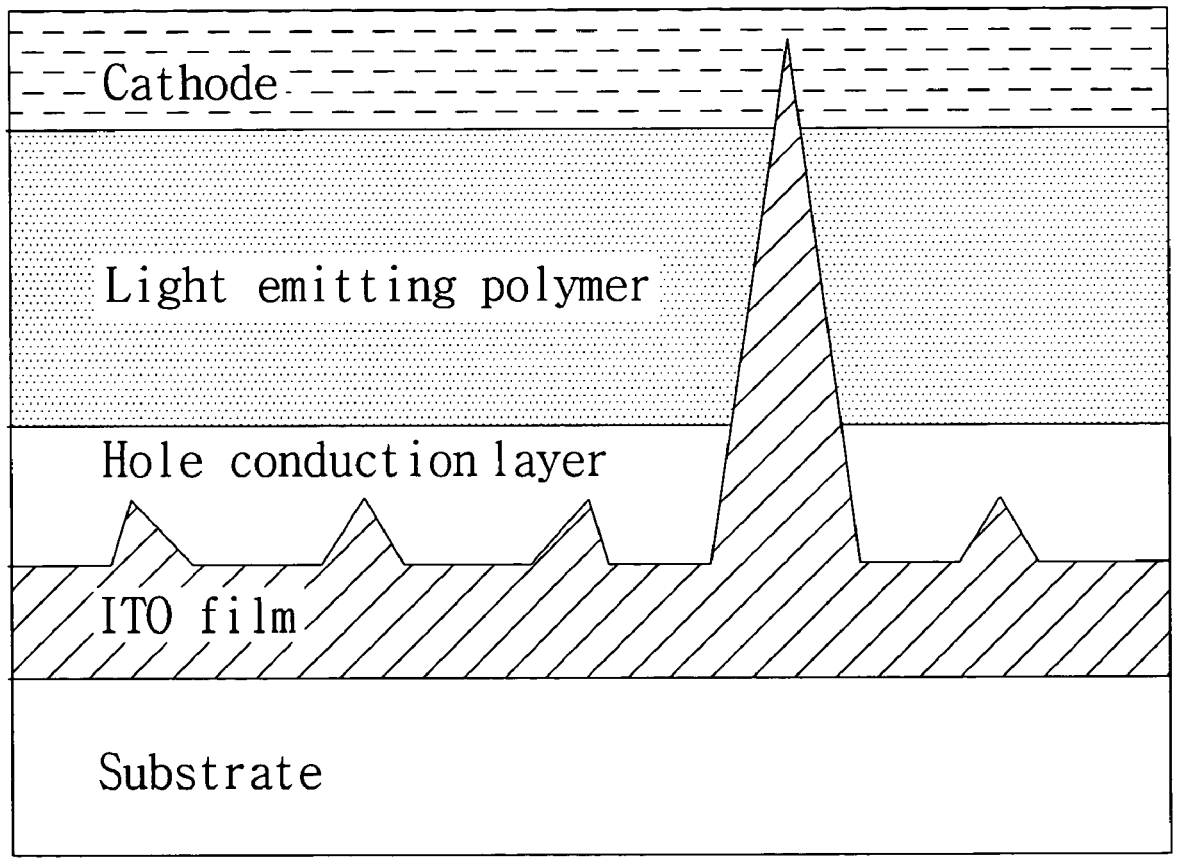
FIG. 1 is a cross-sectional view of an ITO film as a transparent conducting electrode used as an anode of OLED according to a related art.
Figure 2:
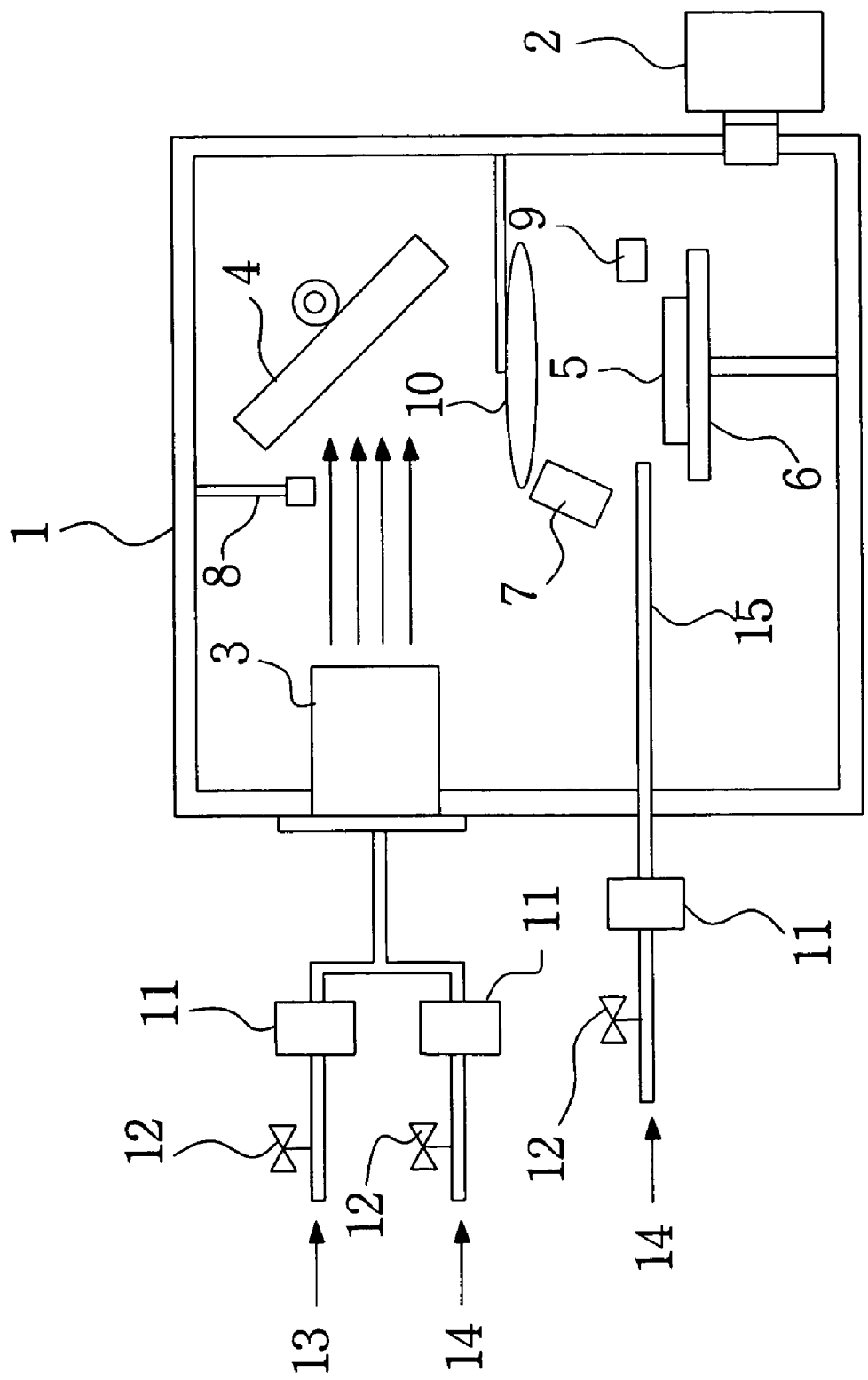
FIG. 2 is a diagram of ion beam sputtering equipments according to the present invention.

FIG. 2 is a diagram of ion beam sputter equipments according to the present invention.

Referring to FIG. 2, an ion beam sputter equipments for forming an ITO film on a substrate includes a vacuum chamber 1 for maintaining vacuum, a pumping system 2 for maintaining the vacuum, an ion source 3 generating an ion beam, a target 4 providing a deposition material, a substrate 5, a substrate holder 6 holding the substrate, a heater 7 heating the substrate, a Faraday cup 8 measuring current density of the ion beam, a thickness monitor 9 measuring real-time deposition thickness, a shutter 10, a gas flow controller 11 controlling gas supplied to the ion source 3 to generating ions and an ambience gas, a gas valve 12, Ar gas 13 as sputtering gas, oxygen 14 as the sputtering gas and/or the ambience gas, and a gas distributor 15 facilitating a flow of the ambience gas. The target 4 for depositing the ITO film employs a rectangular ITO target having a theoretical density over 95% and an oxide composition ratio of 9:1 (90 wt % $In_2O_3$-10 wt % $SnO_2$), and the ion source 3 for sputtering employs a cold hollow cathode ion source. The composition ratio of the ITO target varies according to test conditions. The ion source may employ one of Kaufman ion source, RF ion source, ECR (electron cyclotron resonance) ion source, DC-RF-magnetron sputter, etc. The heater 7 for heating the substrate 5 employs a halogen heater enabling to adjust a substrate temperature of 25° C.~400° C. Besides, the heater 7 may employ an IR (infra red) ray heater.

Figure 3:
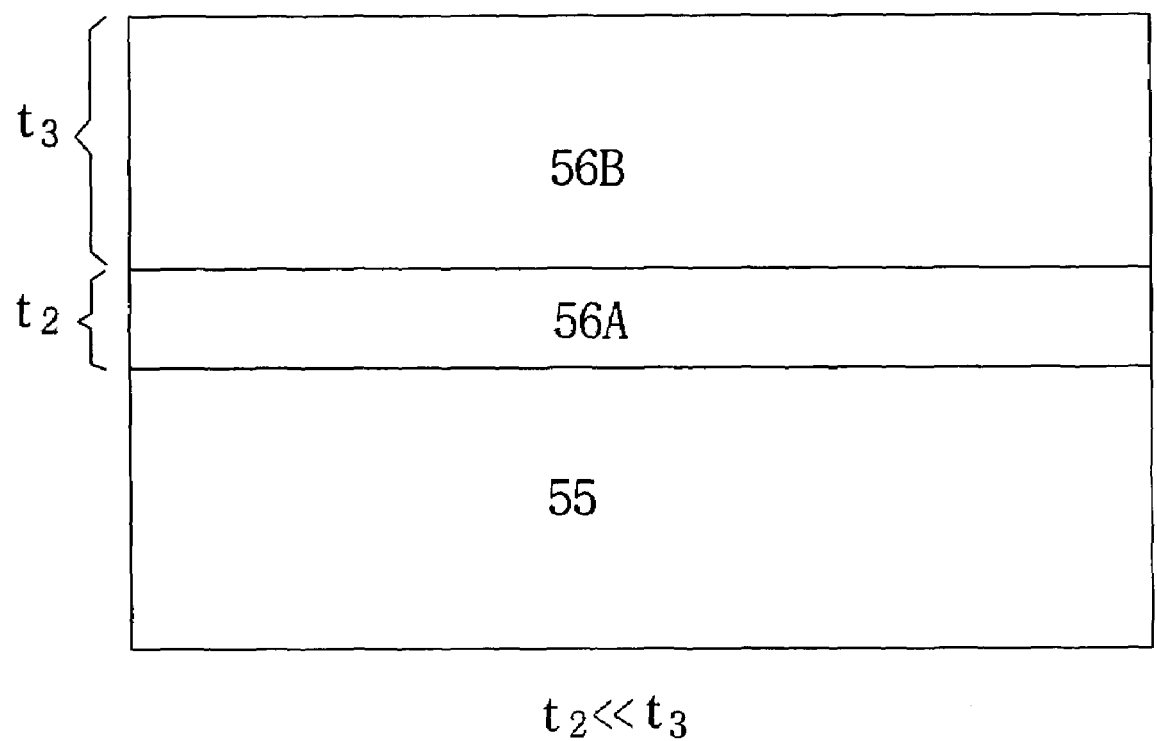
FIG. 3 is a cross-sectional view of a transparent conducting ITO electrode according to the present invention.

FIG. 3 is a cross-sectional view of a transparent conducting ITO electrode according to the present invention. The present invention, as shown in FIG. 2 and FIG. 3, firstly divides a sputtering process for forming an ITO film on a substrate into a seed layer forming process and a bulk layer forming process, and varies each process condition to deposit the ITO film. Hence, the deposited ITO film prevents degradation of the electrical and optical characteristics and provides the ultra-planarized surface properties of RMS≦2 nm and (Rp-v)≦10 nm. And, the present invention is characterized in a sputtering method of depositing a transparent conducting ITO film having the excellent electrical and optical characteristics and the ultra-planarized surface properties of RMS≦2 nm and (Rp-v)≦10 nm. In order to deposit an ultra-planarized ITO film, a sequence of forming an ITO film on a substrate 55, as shown in FIG. 3, is divided into a first step of forming a seed layer 56a and a second step of forming a bulk layer 56b. And, deposition conditions of the layers 56a and 56b are varied, respectively. In doing so, a thickness t2 of the seed layer 56a is deposited thinner than a thickness t3 of the bulk layer 56b.

Preferred embodiments and comparison examples are explained as follows. Yet, the following embodiments and comparison examples are merely exemplary and are not to be construed as limiting the present invention.

In order to facilitate to explain the effects of the present invention, the differences between the embodiments according to the present invention and the comparison examples of the related art deposition methods are evaluated.

A method of forming an ITO film according to the present invention is explained in detail as follows. A target for depositing the ITO film employs a rectangular target having a theoretical density over 95% and an oxide composition ratio of 9:1 (90 wt % $In_2O_3$-10 wt % $SnO_2$). A substrate is a glass substrate formed with one of sodalime glass, non-alkali glass, borosilicate glass, and the like or a polymer substrate formed one of PET (polyethylene terephthalate), PC (polycarbonate), and PES (polyethersulfone). Moreover, the substrate may employ a glass or polymer substrate coated with metal, ceramic, or polymer such as Cr, Mo, $TiO_2$, $SiO_2$, hard-coating, acrylate based coating, color filter coating, or the like. Before performing deposition, a pressure of the vacuum chamber is prepared as $1\times10^{-6}$ torr using the vacuum pump system. A surface of the substrate is cleansed using plasma or ion beam prior to deposition or is pre-treated for forming functional groups thereon. Such a surface pre-treatment enhances an adhesion between the substrate and a film to be deposited thereon. After the pre-treatment of the substrate, gas for sputtering and ambience gas are supplied to the vacuum chamber. The gas for sputtering is argon, oxygen, or a mixed gas of argon and oxygen. A mixed ratio of the mixed gas is adjusted by controlling inflows of argon and oxygen. For the deposition of the ITO film by ion beam sputtering, ion beam energy is set to 1,200 eV and ion beam current density is set to 0.15 mA/cm². The substrate temperature is varied to 400° C. from a room temperature. A distance between the target 4 and the substrate 5 is kept 150 mm, and a distance between the ion source 3 and the target 4 is maintained 100 mm.

Embodiment 1

An ITO film is deposited on a substrate by ion beam sputtering. In a layer forming process, a sequence of forming the ITO layer to be used as an anode electrode of OLED is divided into a first step of forming a seed layer 56a and a second step of forming a bulk layer 56b, and the first and second steps are continuously performed. In forming the seed layer 56a as a first layer, an inflow of 3 ml/min of Ar gas as sputtering gas is supplied to the ion source 3 to produce Ar ions. The produced Ar ions are irradiated to the target 4 for sputtering. And, the sputtering keeps being performed until a thickness of the seed layer 56a becomes 15 nm. Subsequently, in depositing the bulk layer 56b as a second layer, the Ar gas keeps being supplied to the ion source 3 by the same way of the first step, and an inflow of 1 ml/min of oxygen as ambience gas is additionally supplied in the vicinity of the substrate 5 via the gas distributor 15 (oxygen gas can be supplied through the ion source). Sputtering keeps being performed until a thickness of the bulk layer 56b becomes 135 nm. Thus, an overall thickness of the deposited ITO layer is 150 m.

Embodiment 2

An ITO film is deposited on a substrate by ion beam sputtering. In a layer forming process, a sequence of forming the ITO layer to be used as an anode electrode of OLED is divided into a first step of forming a seed layer 56a and a second step of forming a bulk layer 56b, and the first and second steps are continuously performed. In forming the seed layer 56a as a first layer, an inflow of 3 ml/min of Ar gas as sputtering gas is supplied to the ion source 3 to produce Ar ions. The produced Ar ions are applied to the target 4 for sputtering. Together with the sputtering, an inflow of 1 ml/min of oxygen as ambience gas is supplied in the vicinity of the substrate 5 via the gas distributor 15 (oxygen gas can be supplied through the ion source). And, the sputtering keeps being performed until a thickness of the seed layer 56a becomes 15 nm. Subsequently, in order to deposit the bulk layer 56b as a second layer, the supply of the oxygen injected via the gas distributor 15 or the ion source 3 is stopped, and the sputtering is then performed using the Ar ions through the ion source 3 only. Sputtering keeps being performed until a thickness of the bulk layer 56b becomes 135 nm. Thus, an overall thickness of the deposited ITO layer is 150 m.

COMPARISON EXAMPLE 1

An ITO film is deposited on a substrate by ion beam sputtering. In a layer forming process, an ITO film is formed on a substrate by a single step sputter process without forming a seed layer. In this case, an inflow of 3 ml/min of Ar gas as sputtering gas is supplied to the ion source 3 to produce Ar ions. The produced Ar ions are applied to the target 4 for sputtering. Thus, a thickness of the deposited ITO layer is 150 m.

COMPARISON EXAMPLE 2

An ITO film is deposited on a substrate by ion beam sputtering. In a layer forming process, an ITO film is formed on a substrate by a single step sputter process without forming a seed layer. In this case, an inflow of 3 ml/min of Ar gas as sputtering gas is supplied to the ion source 3 to produce Ar ions. The produced Ar ions are applied to the target 4 for sputtering. Together with the sputtering, an inflow of 1 ml/min of oxygen as ambience gas is supplied in the vicinity of the substrate 5 via the gas distributor 15 (oxygen gas can be supplied through the ion source). Thus, a thickness of the deposited ITO layer is 150 m.

Process conditions of the ITO film deposited on the substrate according to Embodiments 1 and 2 and Comparison Examples 1 and 2 are shown in Table 1.

TABLE 1

| | Expression | Comparison Example 1 Ar | Comparison Example 2 ArO | Embodiment 1 Ar/ArO | Embodiment 2 ArO/Ar |
|---|---|---|---|---|---|
| Seed layer | Sputtering gas | X | X | Ar 3 ml/min | Ar 3 ml/min |
| | Ambience gas | X | X | X | Oxygen 1 ml/min |
| | Layer | X | X | 15 nm | 15 nm |

TABLE 1-continued

| | Expression | Comparison Example 1 Ar | Comparison Example 2 ArO | Embodiment 1 Ar/ArO | Embodiment 2 ArO/Ar |
|---|---|---|---|---|---|
| Bulk layer | thickness Sputtering gas | Ar 3 ml/min | Ar 3 ml/min | Ar 3 ml/min | Ar 3 ml/min |
| | Ambience gas | X | oxygen 1 ml/min | Oxygen 1 ml/min | X |
| | Layer thickness | 150 nm | 150 nm | 135 nm | 135 nm |

In Table 1, Comparison Examples 1 and 2 according to the related art deposition methods are designated as Ar method and ArO method, respectively. And, Embodiments 1 and 2 of the deposition methods according to the present invention are designated as Ar/ArO method and ArO/Ar method, respectively. In the Ar method, an entire layer of the ITO electrode is deposited by Ar ions only as the sputtering gas supplied to the ion source. In the ArO method, a layer of the ITO electrode is deposited by Ar ions as the sputtering gas supplied to the ion source under the ambience of oxygen gas flowing in the vicinity of the substrate. In the Ar/ArO method, the seed layer is deposited by Ar ions only as the sputtering gas supplied to the ion source and the bulk layer is deposited on the seed layer by Ar ions as the sputtering gas supplied to the ion source under the ambience of oxygen gas flowing in the vicinity of the substrate. And, in the ArO/Ar method, the seed layer is deposited by Ar ions as the sputtering gas supplied to the ion source under the ambience of oxygen gas flowing in the vicinity of the substrate and the bulk layer is deposited on the seed layer by Ar ions only as the sputtering gas supplied to the ion source.

Figure 4:
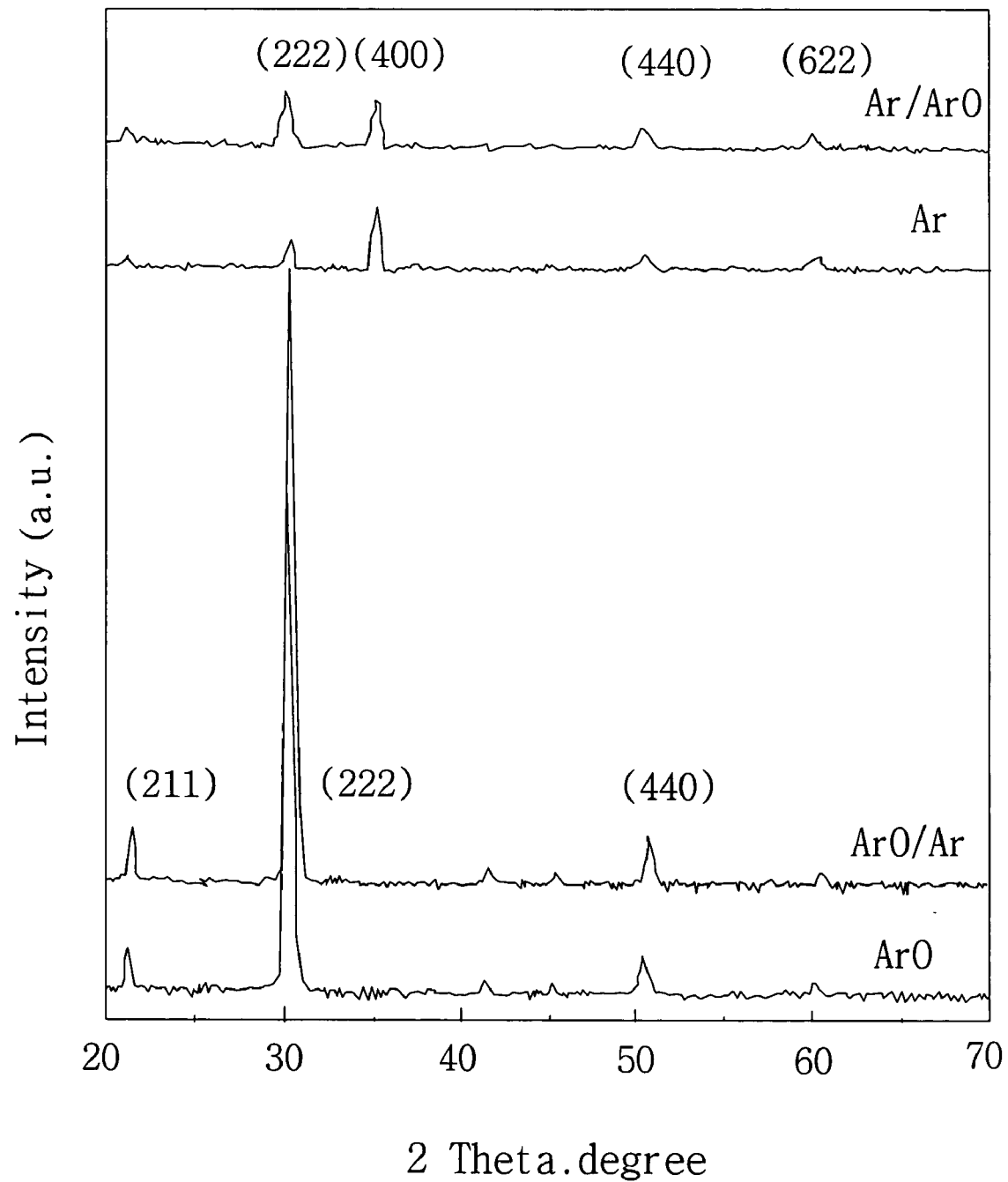
FIG. 4 is a graph of XRD spectrum of a transparent conducting ITO electrode according to embodiments 1 and 2 and comparison examples 1 and 2.

FIG. 4 is a graph of XRD spectrum of a transparent conducting ITO electrode according to embodiments 1 and 2 and comparison examples 1 and 2, which shows XRD analysis results of one case that a single layer is deposited to form an entire layer of the ITO electrode at a deposition temperature of 150° C. and the other case that seed and bulk layers are deposited to form a layer of the ITO electrode at a deposition temperature of 150° C.

Referring to FIG. 4, the ITO electrode deposited by the Ar method has polycrystallinity. Yet, the ITO electrode deposited by the ArO method has preferred orientation in a direction of [111]. In case that the ITO electrodes are deposited by the Ar/ArO and ArO/Ar methods, respectively, the overall crystallinity of each ITO electrode is closely related to the crystallinity of the seed layer as the first layer of the layer forming sequence. The crystallinity of the ITO electrode formed by Ar/ArO method shows polycrystallinity as good as that of the ITO electrode formed by Ar method for the seed layer as the first layer of the layer forming sequence. This can be verified by the XRD analysis result that the polycrystallinity of the seed layer as the first layer of the layer forming sequence appears instead of the [111] preferred orientation of the second ITO layer deposited by ArO method. And, the crystallinity of the ITO electrode formed by ArO/Ar method can be verified by the XRD analysis result of the [111] preferred orientation of the ArO method for depositing the seed layer as the first layer of the layer forming sequence. From such results, it is confirmed that the crystallinity of the entire ITO film depends on the crystallinity of the seed layer in the layer forming sequence of forming the seed and bulk layers separately instead of that of the bulk layer.

FIG. 5A shows SEM and AFM images of surface micro structure and surface roughness of a transparent conducting ITO electrode according to comparison example 1, FIG. 5B shows SEM and AFM images of surface micro structure and surface roughness of a transparent conducting ITO electrode according to comparison example 2, FIG. 5C shows SEM and AFM images of surface micro structure and surface roughness of a transparent conducting ITO electrode according to embodiment 1, and FIG. 5D shows SEM and AFM images of surface micro structure and surface roughness of a transparent conducting ITO electrode according to comparison embodiment 2. In FIGS. 5A to 5D, considered are one case that a single layer is deposited to form an entire layer of the ITO electrode at a deposition temperature of 150° C. and the other case that seed and bulk layers are deposited to form a layer of the ITO electrode at a deposition temperature of 150° C.

The microstructure, as shown in FIG. 5A, of the ITO electrode deposited by the Ar method is a domain structure. In this case, one domain includes a plurality of sub-grains grown in the same direction of crystalline orientation. Yet, the ITO electrode, as shown in FIG. 5B, deposited by the ArO method has a grain structure. And, the surface roughness of the ITO electrode deposited by each method can be recognized by AFM analysis. The ITO electrode deposited by the Ar method has the domain structure and RMS and Rp-v of the ITO electrode are high values of 2.1 nm and 16.3 nm, respectively. Yet, RMS and Rp-v of the ITO electrode deposited by ArO method are considerably low values of 0.5 nm and 3.9 nm, respectively.

In FIG. 5C and FIG. 5D, in case of the layer forming sequence of the ITO layer divided into the seed and bulk layers, microstructure and surface roughness of each of ITO electrodes deposited by Ar/ArO and ArO/Ar methods, respectively are shown.

Referring to FIG. 5C, the microstructure of the ITO electrode by the Ar/ArO method is the domain structure. This indicates that the domain structure, which is the microstructure of the seed layer deposited by the Ar method as the first step of the Ar/ArO method, determines the overall microstructure of the Ar/ArO method, whereas the microstructure of the ITO electrode deposited by the ArO method only is the grain structure. Likewise, the microstructure of the ITO electrode, as shown in FIG. 5D, formed by the ArO/Ar method is the grain structure of the seed layer deposited by the ArO method as the first step. Hence, the overall microstructure of the ITO electrode using the seed layer of the first step greatly depends on the microstructure of the seed layer in case of the layer forming sequence of the ITO layer divided into the seed and bulk layers, which coincides with the XRD analysis result. In the surface roughness of the ITO electrode using the seed layer, RMS and Rp-v of the Ar/ArO method are 1.1 nm and 7.9 nm, respectively. And, RMS and Rp-v of the ArO/Ar method are considerably low values of 0.4 nm and 3.7 nm, respectively. Such results coincide with the surface roughness of the ITO electrodes deposited by the Ar and ArO methods, respectively. Hence, it can be seen that the lowest surface roughness is attained in case of using the ArO and Ar methods for the seed and bulk layers, respectively.

Figure 6:
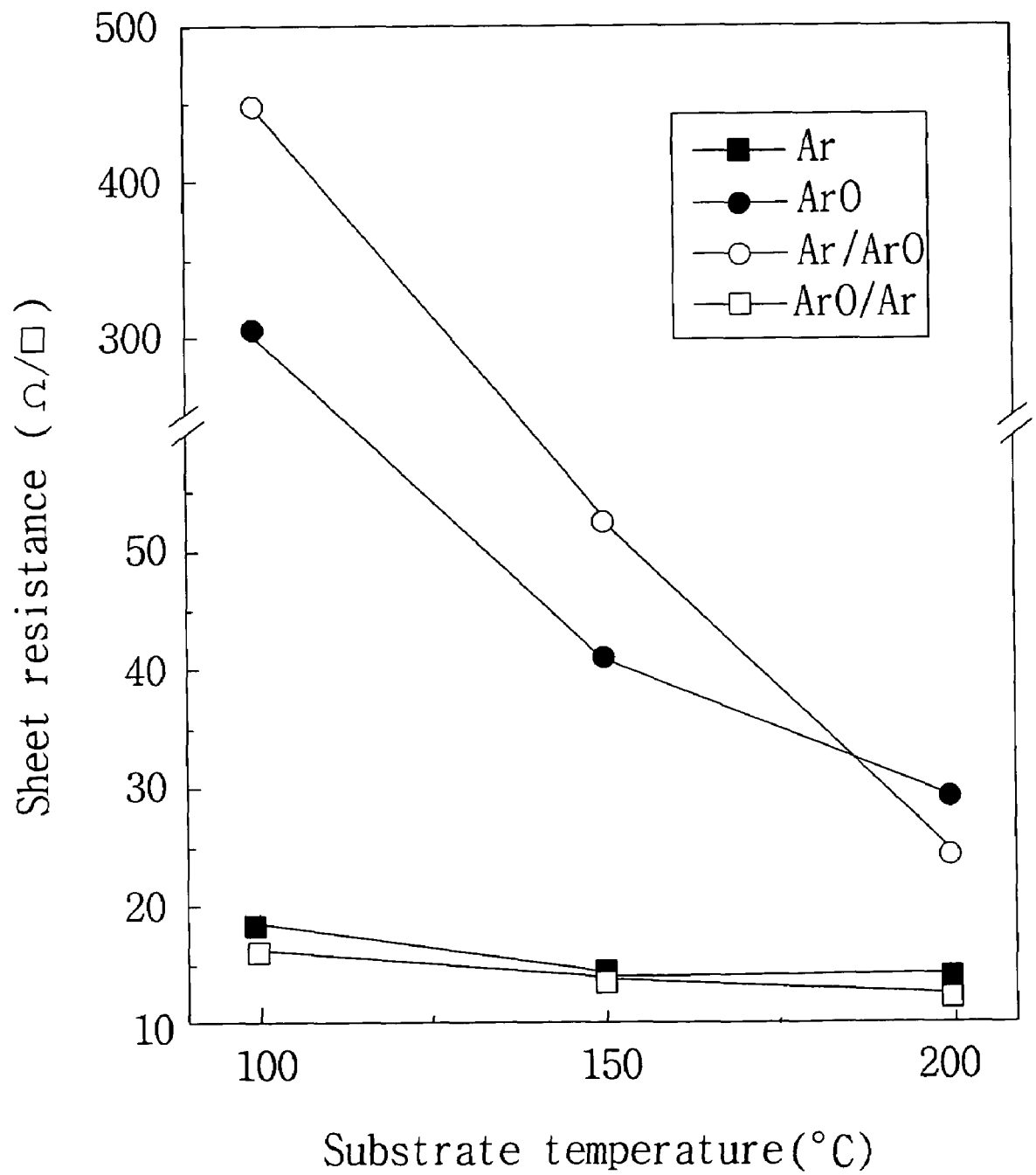
FIG. 6 is a graph of sheet resistance variation of a transparent conducting ITO electrode according to embodiments 1 and 2 and comparison examples 1 and 2.

FIG. 6 is a graph of sheet resistance variation of a transparent conducting ITO electrode according to embodiments 1 and 2 and comparison examples 1 and 2.

A sheet resistance of an ITO electrode is measured by four-points probe in case that an ITO layer is formed by depositing a single layer only according to a deposition temperature. And, another sheet resistance of an ITO electrode is measured by four-points probe in case that an ITO layer is formed by depositing a seed layer and a bulk layer sequentially.

In case of a single ITO layer formed by the Ar or ArO method, a sheet resistance of the ITO electrode by the Ar method is 18.3Ω/□~14.0Ω/□. And, a sheet resistance of the ITO electrode by the ArO method is 304.0Ω/□~29.3Ω/□, which is relatively high. When the layers are formed by the Ar and ArO methods with different deposition specifications, respectively, the sheet resistance of the ITO electrode formed by the ArO method is higher than that of the other ITO electrode formed by the Ar method. This is because the former electrode is more oxidized by the ambience oxygen gas flowing in the vicinity of the substrate.

In case of an ITO electrode having a seed layer in the layer forming sequence of seed/bulk layers, the ITO electrode by the Ar/ArO method has relatively high resistance of 446.0Ω/□~24.5Ω/□. And, the other ITO electrode by the ArO/Ar method has the lowest resistance of 16.1Ω/□~12.5Ω/□. In aspect of the sheet resistance monitoring results of the single-layered ITO electrode and the seed-layered ITO electrode of the seed/bulk layers sequence, the sheet resistance of the seed-layered ITO electrode depends on the deposition specification of the bulk layer. This is because the bulk layer is relatively thicker than the seed layer. The above-explained results are summarized in Table 2 according to the deposition conditions or specifications.

Figure 7:
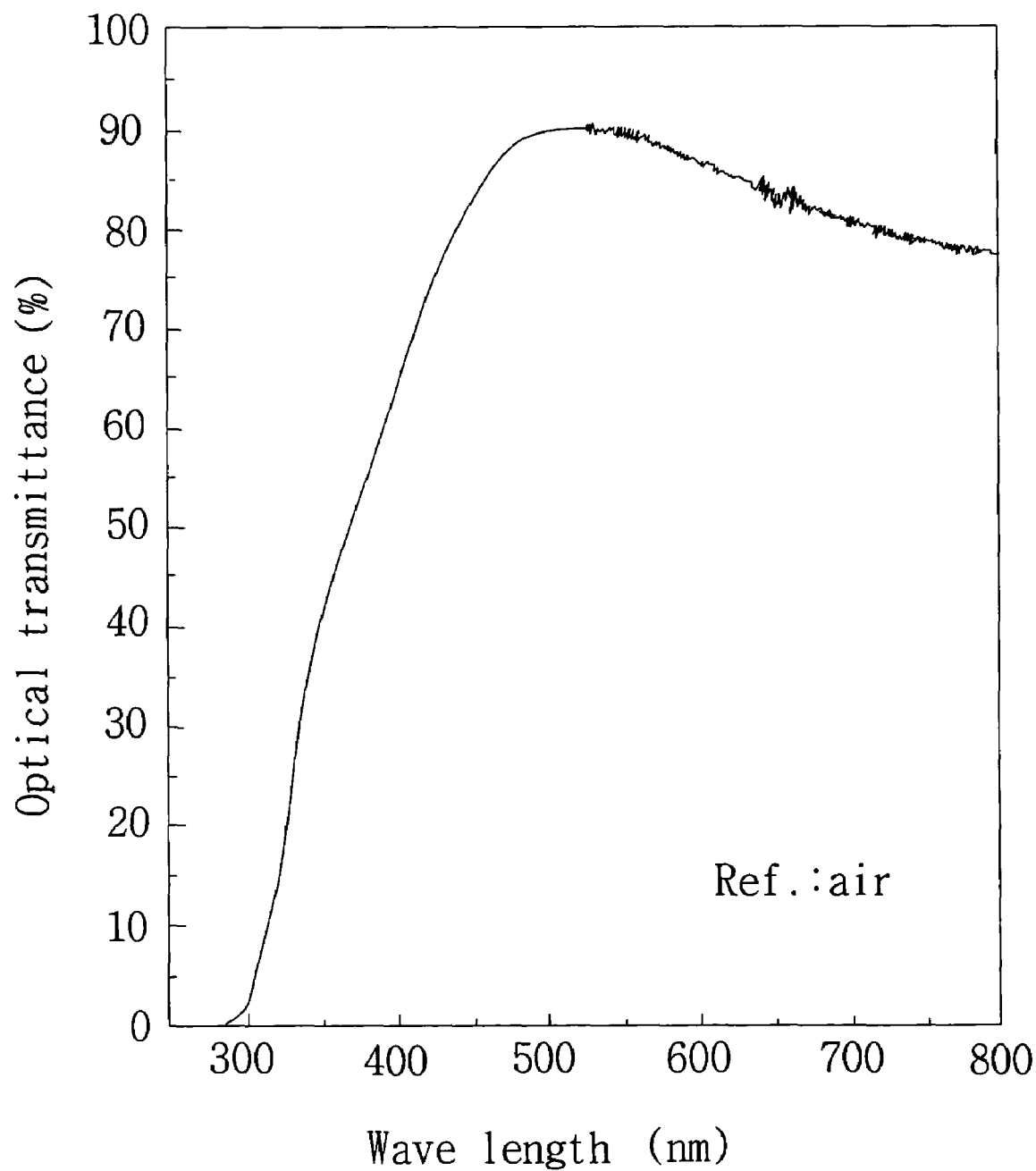
FIG. 7 is a graph of transmittance in a visible ray range of a transparent conducting ITO electrode according to a second embodiment of the present invention.

FIG. 7 is a graph of transmittance in a visible ray range of a transparent conducting ITO electrode according to a second embodiment of the present invention, in which transmittance of an ITO electrode formed by the ArO/Ar method at 150° C. of a substrate temperature in a visible ray area is shown.

The ITO electrode, which is deposited by the ArO/Ar method showing the most planarized surface attribute and the excellent electrical characteristic, has at least 85% transmittance in the visible ray area.

Meanwhile, the substrate temperature has almost no influence on the microstructure, surface property, and electrical/optical characteristics of the ITO electrode deposited at a substrate temperature of 200° C.~400° C. And, such an ITO electrode has the same attributes or properties of the ITO electrode deposited at the substrate temperature of 150° C.

Comparison between ITO electrodes according to deposition methods of the related art and the present invention is shown in Table 2.

deposited by varying a deposition process of the seed and bulk layers to have the electrical/optical characteristics superior to those of the ITO electrode by the related art single-layered deposition process and the ultra-planarized surface property of surface roughness of RMS≦2 nm and Rp-v≦10 nm. In case of the ITO layer forming sequence divided into the seed and bulk layers having different deposition process conditions, respectively, the structural properties of the overall deposited ITO electrode such as crystallinity, microstructure, surface roughness, and the like are determined by the seed layer, whereas the electrical characteristics of the overall ITO electrode are determined by the bulk layer. Hence, by changing the process conditions of the sputtering deposition of the seed and bulk layers, the structural properties and electrical characteristics of the overall deposited ITO electrode can be controlled. Moreover, such results are applicable to RF- or DC-magnetron sputtering in the same manner. In case of using RF- or DC-magnetron sputtering, like the ion beam sputtering, the mixed ratio of the sputtering gas, i.e., mixed ratio of oxygen vs. argon used as sputtering gas, substrate temperature, distance between target and substrate, sputtering power, and sputtering pressure are adjusted to change the sputtering conditions of the seed and bulk layers. The ITO electrode, which is deposited by sputtering using the seed layer to have the ultra-planarized surface property, is expected to be used as a display electrode of OLED or the like.

Accordingly, the present invention enables to deposit the ITO film, which has the extremely flat surface property and prevents the electrical and optical characteristics from being degraded, by the optimal sputter deposition process for sequentially forming the seed and bulk layers having different deposition conditions. And, the ITO film can be fabricated into the ITO electrode on the transparent substrate without mechanical an/or chemical polishing to have the extremely flat surface of which RMS and Rp-v are below 0.4 nm and 3.7 nm, respectively.

Compared to those of the related art ITO film, charge carrier scattering, spark generation, and pin hole generation, which are generally caused by the rough surface, of the ITO electrode formed by the sputtering deposition process are considerably reduced, whereby the ITO film of the present invention is applicable to the ITO electrode of OLED.

Moreover, the optimal sequential sputter deposition process according to the present invention simplifies the fabricating process and reduces costs of fabrication.

TABLE 2

| | Crystalline structure | Micro Struc. | Surface roughness (nm) | | | | | | Sheet resistance (Ω/□) | | |
|---|---|---|---|---|---|---|---|---|---|---|---|
| | | | 100° C. | | 150° C. | | 200° C. | | | | |
| | | | RMS | $R_{p-v}$ | RMS | $R_{p-v}$ | RMS | $R_{p-v}$ | 100° C. | 150° C. | 200° C. |
| Ar | Poly-crystalline | Domain | 2.2 | 15.4 | 2.1 | 16.3 | 2.1 | 16.4 | 18.3 | 14.4 | 14.0 |
| ArO | [111] preferred orientation | Grain | 0.4 | 3.9 | 0.5 | 4.0 | 0.4 | 4.3 | 304.0 | 41.0 | 29.3 |
| Ar/ArO | Poly-crystalline | Domain | 1.0 | 7.8 | 1.1 | 7.9 | 1.2 | 8.3 | 446.0 | 52.6 | 24.5 |
| ArO/Ar | [111] preferred orientation | Grain | 0.3 | 2.0 | 0.4 | 3.7 | 1.6 | 20 | 16.1 | 13.8 | 12.5 |

In the present invention using the seed layer in a sputtering process, the transparent conducting ITO electrode is The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. In forming a transparent conducting electrode of a display device on a transparent substrate with an ITO film including a seed layer and a bulk layer, a method of forming the ITO film, comprising:
    a first sputter deposition step of forming the seed layer having a crystal orientation, wherein a sputtering gas is supplied and there exists an ambience of oxygen flowing in the vicinity of the substrate; and
    a second sputter deposition step of forming the bulk layer on said seed layer, wherein the sputtering gas is supplied only,
    wherein the bulk layer assumes the crystal orientation of the seed layer.

2. The method of claim 1, wherein a pre-treatment is performed on a surface of the substrate to clean or to form functional groups thereon using plasma or ion beam.

3. The method of claim 2, wherein an adhesion between the ITO film and the substrate is enhanced by the pre-treatment.

4. The method of claim 1, wherein a thickness of the seed layer is 1~100 nm to be smaller than that of the bulk layer.

5. The method of claim 1, wherein the display device is selected from the group consisting of a liquid crystal display, a plasma display panel, a touch panel, and an organic light emitting device.

6. The method of claim 1, wherein the transparent substrate is a glass substrate formed with one of sodalime glass, non-alkali glass, and borosilicate glass, a polymer substrate formed one of PET (polyethylene terephthalate), PC (polycarbonate), and PES (polyethersulfone), or the glass or polymer substrate coated with metal, ceramic, or polymer such as Cr, Mo, $TiO_2$, $SiO_2$, hard-coating, acrylate based coating, or color filter coating.

7. The method of claim 1, wherein the sputter deposition step is selected from the group consisting of DC magnetron sputtering, RF magnetron sputtering, medium frequency magnetron sputtering, and ion beam sputtering.

8. The method of claim 1, wherein the sputtering gas is sputtered to a target material to form the ITO film on the substrate.

9. The method of claim 1, wherein a deposition process condition of the bulk layer determines sheet resistance of the ITO film.

10. The method of claim 1, wherein a deposition process condition of the seed layer determines crystallinity of the ITO film.

11. The method of claim 1, wherein said second sputter deposition step is performed in the absence of oxygen flowing in the vicinity of the substrate.

12. The method of claim 1, wherein the crystal orientation is.

* * * * *